United States Patent
Guentert

(10) Patent No.: US 9,812,242 B1
(45) Date of Patent: Nov. 7, 2017

(54) SYSTEMS AND METHODS FOR LIQUID HEAT EXCHANGE FOR TRANSFORMERS

(71) Applicant: Power Distribution Systems Development LLC, Wilmington, DE (US)

(72) Inventor: Joseph M. Guentert, Cincinnati, OH (US)

(73) Assignee: Power Distribution Systems Development LLC, Wilmington, DE (US)

(*) Notice: Subject to any disclaimer, the term of this patent is extended or adjusted under 35 U.S.C. 154(b) by 16 days.

(21) Appl. No.: 15/159,387

(22) Filed: May 19, 2016

(51) Int. Cl.
H01F 27/10 (2006.01)
H01F 27/08 (2006.01)
H01F 27/16 (2006.01)
H05K 7/20 (2006.01)

(52) U.S. Cl.
CPC ......... *H01F 27/16* (2013.01); *H05K 7/20263* (2013.01)

(58) Field of Classification Search
CPC ........... H05K 7/20; H01F 27/16; H01F 27/10; H01F 27/105; H01F 27/12; H01F 27/125; H01F 27/14
USPC ........................................ 336/55–61, 90, 94
See application file for complete search history.

(56) References Cited

U.S. PATENT DOCUMENTS

| | | | | |
|---|---|---|---|---|
| 3,634,798 A * | 1/1972 | Astleford, Jr. | .......... | H01F 27/02 174/17 LF |
| 4,485,367 A * | 11/1984 | Hashizume | ............. | H01F 27/18 174/15.1 |
| 4,904,972 A * | 2/1990 | Mori | ....................... | H01F 27/02 336/55 |
| 6,184,459 B1 | 2/2001 | McShane et al. | | |
| 6,909,349 B1 | 6/2005 | Longardner et al. | | |
| 8,081,054 B2 | 12/2011 | Guentert, III et al. | | |
| 8,305,178 B2 | 11/2012 | Yang | | |
| 2008/0314077 A1* | 12/2008 | Rim | ....................... | F01K 25/10 62/513 |
| 2011/0140820 A1* | 6/2011 | Guentert, III | .......... | H01F 27/12 336/58 |

(Continued)

OTHER PUBLICATIONS

"Envirotemp™ FR3™ Fluid Behavior in Cold Temperature Environments"; URL: http://www.cargill.co.in/wcm/groups/public/@ccom/documents/document/na3076889.pdf; Cargill, Incorporated. 2013.

Primary Examiner — Mangtin Lian
(74) Attorney, Agent, or Firm — Dinsmore & Shohl LLP

(57) ABSTRACT

Systems and methods for liquid heat exchange for transformers are described. One embodiment of a fluid heat exchanger includes a transformer inlet port that is coupled to a transformer chamber and receives a dielectric fluid from the transformer chamber. Also included are a cooling fluid inlet for receiving a cooling fluid and a finned heat sink that includes a fluid communicator. The fluid communicator may receive, at a first chamber, the dielectric fluid from the transformer inlet port and directs the dielectric fluid across a first plurality of cooling fins. The fluid communicator may receive, at a second chamber, the cooling fluid from the cooling fluid inlet and may direct the cooling fluid across a second plurality of fins, where the fluid communicator separates the first chamber from the second chamber with a solid divider.

20 Claims, 6 Drawing Sheets

(56) References Cited

U.S. PATENT DOCUMENTS

| | | | |
|---|---|---|---|
| 2013/0307654 A1* | 11/2013 | Hyde | H01F 27/2876 336/60 |
| 2015/0055298 A1* | 2/2015 | You | F28D 15/00 361/699 |
| 2015/0109087 A1 | 4/2015 | Golner et al. | |
| 2015/0325358 A1* | 11/2015 | Peinbauer | H01F 27/14 336/58 |

* cited by examiner

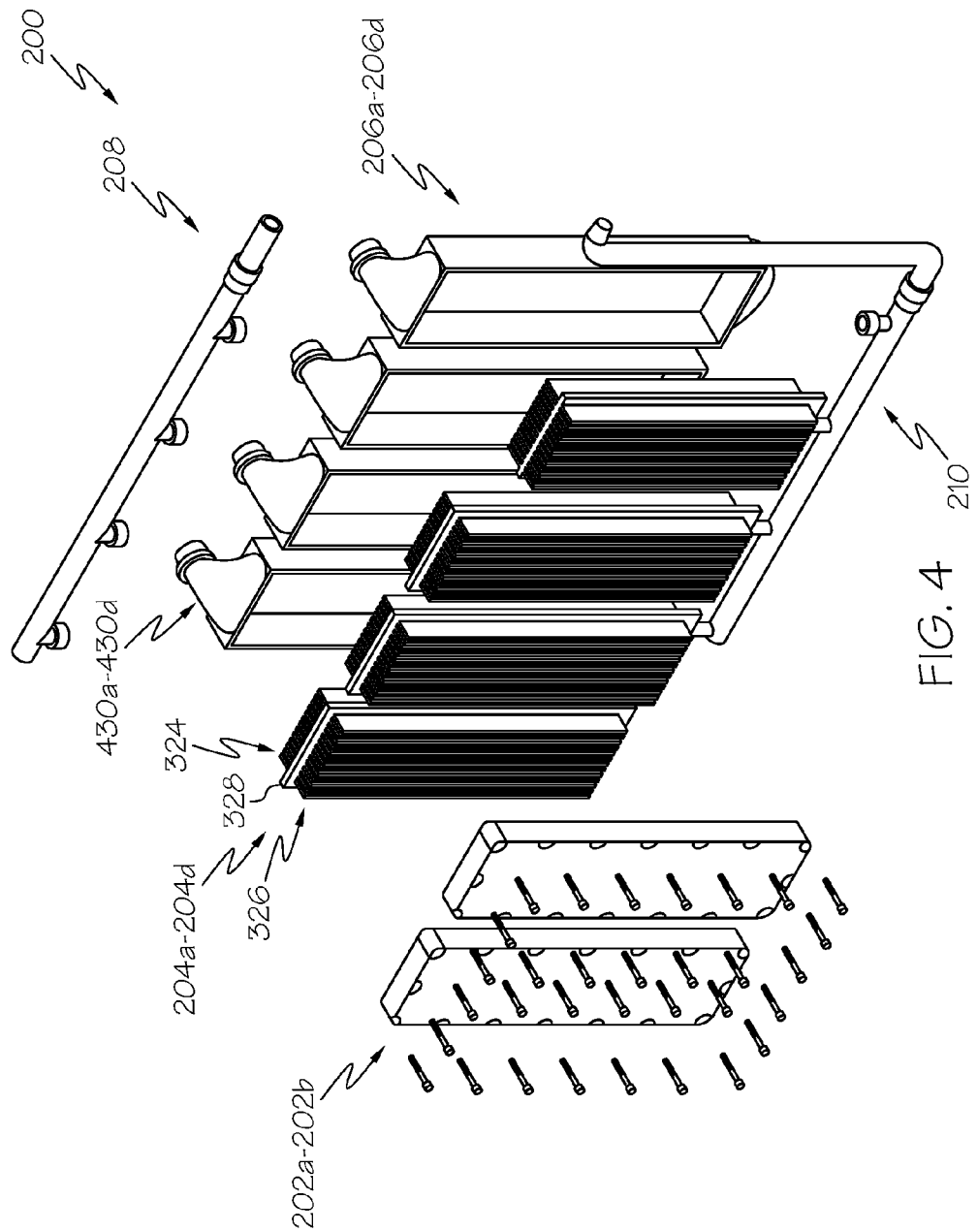

US 9,812,242 B1

SYSTEMS AND METHODS FOR LIQUID HEAT EXCHANGE FOR TRANSFORMERS

TECHNICAL FIELD

Embodiments described herein generally relate to systems and methods for liquid heat exchange for transformers and, more specifically, to embodiments for utilizing liquid-to-liquid heat transfer.

BACKGROUND

As background, traditional liquid-filled transformers utilize large radiator banks with many hollow fins manifolded to the transformer's internal liquid, which serves to cool the internal liquid of the transformer via natural convection of ambient air over the fins. In some cases, additional cooling is achieved by forced convection. As the industry demands physically smaller transformers with increased power capacity, it is often necessary to drive additional cooling effectiveness beyond forced-convection of air. Such technological advancement will provide major advantages to industry by delivering smaller, more efficient, higher-capacity transformers ultimately reducing cost to both manufacturers and purchasers, a need exists for more efficient cooling.

SUMMARY

Systems and methods for liquid heat exchange for transformers are described. One embodiment of a fluid heat exchanger includes a transformer inlet port that is coupled to a transformer chamber and receives a dielectric fluid from the transformer chamber. Also included are a cooling fluid inlet for receiving a cooling fluid and a finned heat sink that includes a fluid communicator. The fluid communicator may receive, at a first chamber, the dielectric fluid from the transformer inlet port and directs the dielectric fluid across a first plurality of cooling fins. The fluid communicator may receive, at a second chamber, the cooling fluid from the cooling fluid inlet and may direct the cooling fluid across a second plurality of fins, where the fluid communicator separates the first chamber from the second chamber with a solid divider.

In another embodiment, a method includes receiving a dielectric fluid from a transformer, where the dielectric fluid has an elevated temperature, receiving a cooling fluid, and directing the dielectric fluid across a first plurality of cooling fins in a first chamber. Some embodiments include directing the cooling fluid across a second plurality of cooling fins in a second chamber, where the first chamber and the second chamber are coupled via a solid divider, and where the solid divider is configured as a thermal conductor to communicate heat from the dielectric fluid to the cooling fluid. In some embodiments the solid divider prevents the dielectric fluid from physically contacting the cooling fluid. Some embodiments include returning the dielectric fluid to the transformer and disposing the cooling fluid after receiving heat from the dielectric fluid.

In yet another embodiment, a system includes a transformer that generates heat, where the transformer includes a transformer chamber for circulating a dielectric fluid and a fluid heat exchanger that is coupled to the transformer. The fluid heat exchanger may include a first transformer inlet port that is coupled to the transformer chamber and receives the dielectric fluid from the transformer chamber, where the dielectric fluid is received at an elevated temperature. The fluid heat exchanger may also include a cooling fluid inlet, for receiving a cooling fluid, a first finned heat sink that includes a first fluid communicator. The first finned heat sink may receive, at a first chamber, the dielectric fluid from the first transformer inlet port and directs the dielectric fluid across a first plurality of cooling fins. The first finned heat sink may receive, at a second chamber, the cooling fluid from the cooling fluid inlet and may direct the cooling fluid across a second plurality of fins. The first finned heat sink may separate the first chamber from the second chamber with a first solid divider that is thermally conductive such that heat from the dielectric fluid is communicated to the cooling fluid. The system may also include a cooling fluid return that disposes the cooling fluid after receiving heat from the dielectric fluid a first transformer outlet port that returns the dielectric fluid to the transformer chamber after communicating heat to the cooling fluid.

These and additional features provided by the embodiments of the present disclosure will be more fully understood in view of the following detailed description, in conjunction with the drawings.

BRIEF DESCRIPTION OF THE DRAWINGS

The embodiments set forth in the drawings are illustrative and exemplary in nature and not intended to limit the disclosure. The following detailed description of the illustrative embodiments can be understood when read in conjunction with the following drawings, where like structure is indicated with like reference numerals and in which:

FIG. 4 depicts an exploded view of a fluid heat exchanger, according to embodiments described herein.

DETAILED DESCRIPTION

Embodiments disclosed herein include systems and methods for a fluid heat exchanger. Some embodiments may be designed to interface with the transformer's existing bolt-on radiator bank interfaces. Accordingly, embodiments described herein pass heat from dielectric fluid, across a finned-aluminum heat sink, and into cooling fluid. As these embodiments may be utilized indoors for data centers, the cooling fluid source may be the building's chilled water supply, which is readily available throughout data centers because it is used to cool computer rooms as well as electrical rooms, where the transformers are typically located.

As described in more detail below, the dielectric fluid may circulate from the transformer chamber to a transformer inlet port. A cooling fluid loop (open loop and/or closed loop, depending on the embodiment) is circulated adjacent to the dielectric fluid, and circulates cooling fluid, such as water, saline, etc. A heat sink (which may be constructed of aluminum or other thermal conductor) may be disposed between the cooling fluid and dielectric fluid. The systems and methods for a liquid cooling or fluid heat exchanger incorporating the same will be described in more detail, below.

Figure 1:
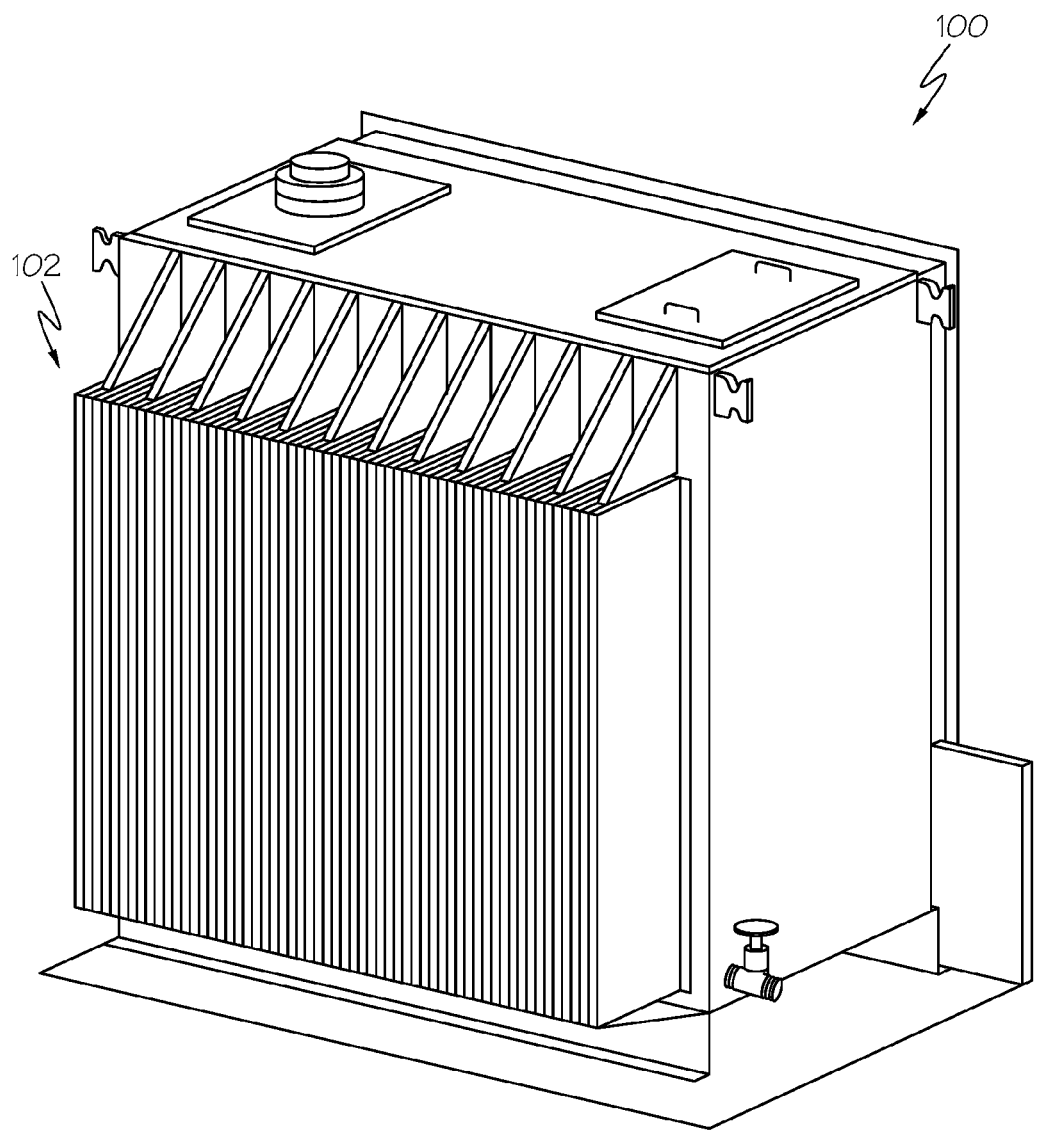
FIG. 1 depicts a transformer according to embodiments described herein.

Referring now to the drawings, FIG. 1 depicts a transformer 100 according to embodiments described herein. As illustrated, the transformer 100 may be configured for converting electrical power from a first voltage into a second voltage. As discussed above, the transformer 100 may be configured as an indoor transformer that operates between about 750 kilo-Volt-Ampere (kVA) and about 9000 kVA. Some embodiments of the transformer 100 may be configured as an indoor-liquid transformer designed for indoor use in a data center. Specifically, the liquid insulator may include FR3 or other dielectric fluid. Accordingly, while previous solutions utilize one or more radiator banks 102 that extend outward from a back of the transformer 100, embodiments of the transformer 100 may include a liquid cooling mechanism for providing cooling of the transformer 100.

Figure 2:
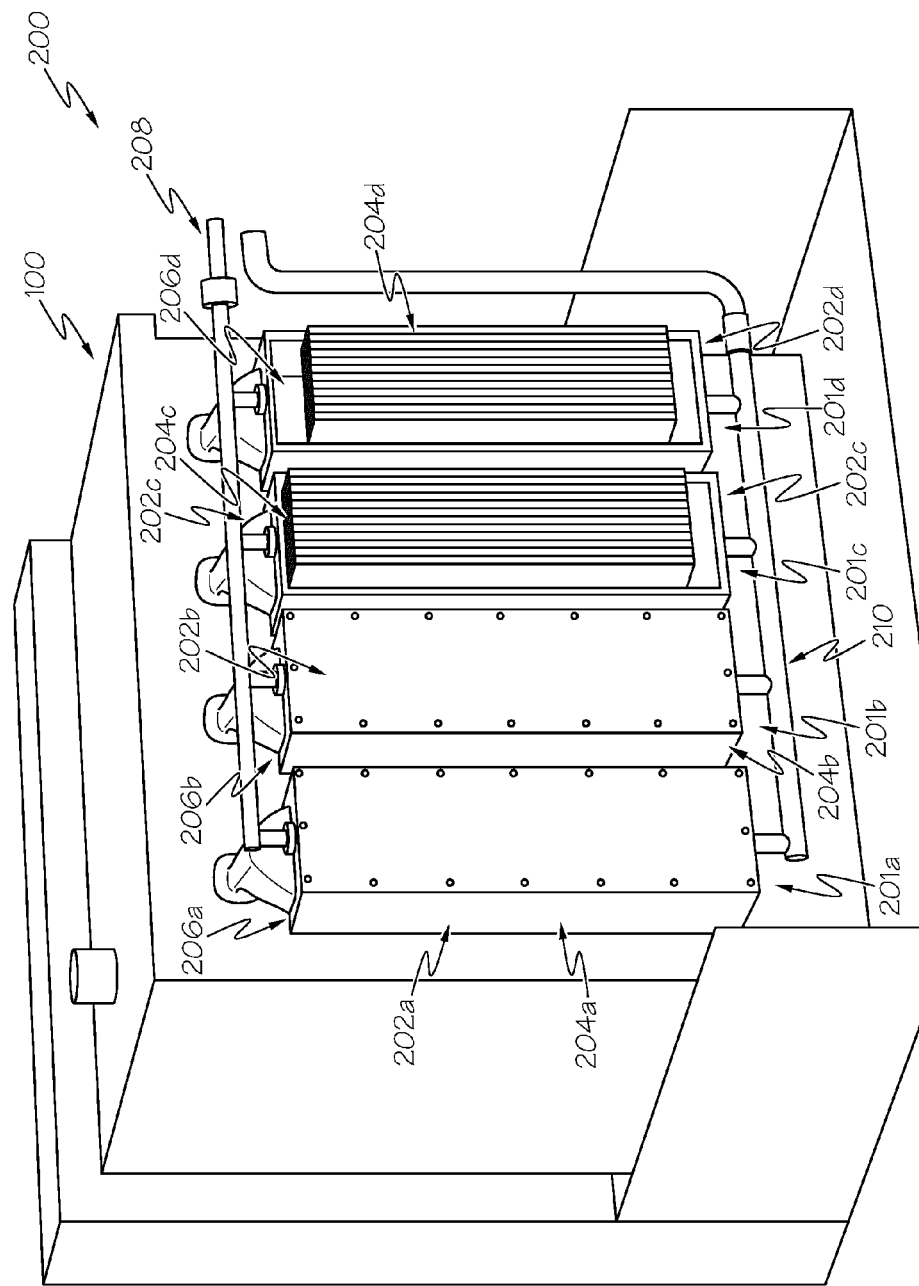
FIG. 2 depicts a transformer with a fluid heat exchanger, according to embodiments described herein.

FIG. 2 depicts a transformer 100 with a liquid cooling heat exchanger, such as heat exchanger 200, according to embodiments described herein. As illustrated, the heat exchanger 200 may be coupled and/or closely coupled to a surface of the transformer 100 to provide access to the dielectric fluid that is stored inside the transformer 100. Due to the space constraints, embodiments described herein may be closely coupled such that the heat exchanger 200 is disposed within about 24 inches or less of the transformer 100; in some embodiments within about 12 inches or less of the transformer 100, and in some embodiments within about 6 inches or less of the transformer 100.

The heat exchanger 200 may include a first finned heat sink 201a, a second finned heat sink 201b, a third finned heat sink 201c, and a fourth finned heat sink 201d (referred to collectively as "the finned heat sinks 201") which each includes a first cooling fluid casing 202a, a second cooling fluid casing 202b, a third cooling fluid casing 202c, and a fourth cooling fluid casing 202d (referred to collectively as "the cooling fluid casings 202") that enclose a first fluid communicator 204a (not explicitly shown in FIG. 2), a second fluid communicator 204b (also not explicitly shown in FIG. 2), a third fluid communicator 204c, and a fourth fluid communicator 204d respectively (referred to herein as "the fluid communicators 204") that each include a plurality of cooling fins and define a first chamber, a second chamber, a third chamber, and a fourth chamber respectively. Also included are a first dielectric fluid casing 206a, a second dielectric fluid casing 206b, a third dielectric fluid casing 206c, and a fourth dielectric fluid casing 206d (referred to collectively as "the dielectric fluid casings 206"), which are also utilized to enclose the finned heat sinks 201.

Also depicted in FIG. 2 are a cooling fluid inlet 208 and a cooling fluid return 210. As described in more detail below, the cooling fluid inlet 208 may receive water, saline, and/or other cooling fluid. The cooling fluid may be distributed through the fluid communicators 204. The cooling fluid may receive heat from the dielectric fluid (which is not in physical contact with the cooling fluid, but separated by a thermal conductor within the finned heat sinks 201). As such, when the dielectric fluid is received from the transformer chamber, the dielectric fluid may have an elevated temperature (relative to the temperature of the cooling fluid) and thus may include a predetermined amount of heat. The cooling fluid may then cycle to the cooling fluid return 210 and disposed (such as in an open loop) or cooled and recirculated (such as in a closed loop).

Figure 3:
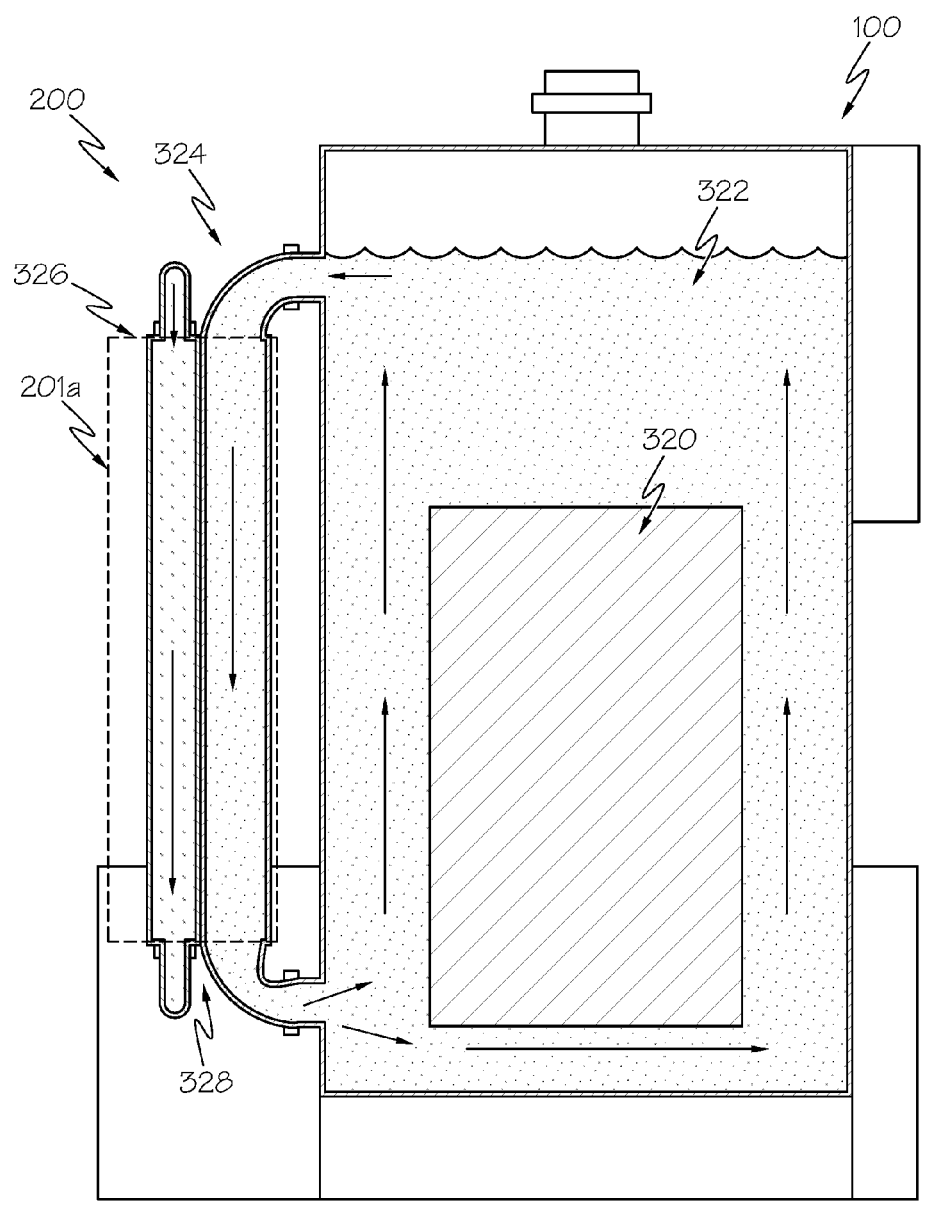
FIG. 3 depicts a side view of a fluid heat exchanger, according to embodiments described herein.

FIG. 3 depicts a side view of a heat exchanger 200, according to embodiments described herein. As illustrated, the transformer 100 includes a transformer coil 320 that generates heat based on the voltage conversion. The heat is transferred to the dielectric fluid in an internal transformer chamber 322. The heated dielectric fluid is communicated from the internal transformer chamber 322 to a transformer side 324 of the finned heat sinks 201, which defines a first chamber. As described above, cooling fluid may be communicated to a heat exchanger side of the finned heat sinks 201 via the heat exchanger side 326 of the finned heat sinks 201. As also illustrated, a solid divider 328 is disposed between the heat exchanger side 326 (which defines a second chamber) and the transformer side 324 of the finned heat sinks 201. It should be understood that 328 a first solid divider may be utilized for the first finned heat sink 201a and a second solid divider may be utilized for the second finned heat sink 201b. Solid dividers may be provided for the remaining finned heat sinks 201.

Regardless, the solid divider 328 may be constructed of aluminum, copper, brass, carbon nanotubes, iron, and/or other thermally conductive material that communicates heat from the transformer 100 to the cooling fluid, while preventing cooling fluid from physically contacting the dielectric fluid. It should be understood that a third chamber and fourth chamber may be defined by the second finned heat sink 201b. Other chambers may be provided by the remaining finned heat sinks 201c, 201d.

It should be understood that while many embodiments do not utilize a motor, some embodiments may include a motor (such as a first motor), pump, and/or other mechanism for directing the dielectric fluid into the heat exchanger 200. As such, the dielectric fluid may be directed at a flow rate (such as a first flow rate). In some embodiments, this mechanism may provide a substantially constant flow of dielectric fluid to the heat exchanger 200. Some embodiments however, may include a thermostat (such as a first thermostat) to vary the flow of dielectric fluid, based on the temperature of the dielectric fluid. Similarly, the cooling fluid in the heat exchanger side 326 may be directed (at a second flow rate) through the force provided by the cooling fluid source and/or via a motor (such as a second motor), pump, and/or other mechanism to control flow of the cooling fluid. Again, this second flow rate may be substantially constant and/or may vary based on a temperature of the transformer 100, the cooling fluid, and/or the dielectric fluid, such as via a second thermostat.

FIG. 4 depicts an exploded view of a heat exchanger 200, according to embodiments described herein. As illustrated, the dielectric chamber casings 206 may include a first transformer inlet port 430a, a second transformer inlet port 430b, a third transformer inlet port 430c, and a fourth transformer inlet port 430d (referred to collectively as the transformer inlet ports 430) for receiving the dielectric fluid in the transformer side 324. The dielectric fluid is communicated across the cooling fins of the fluid communicators 204, which collects heat for communicating to the cooling fluid. Similarly, the cooling fluid is provided by the cooling fluid inlet 208 and communicated to the heat exchanger side 326 of the fluid communicators 204. The cooling fluid then flows across the cooling fins on the heat exchanger side 326 to be removed by the cooling fluid return 210. Also illustrated is the solid divider 328, which creates two separate chambers in the fluid communicators 204; a first chamber between the solid divider 328 and the dielectric chamber casings 206 and a second chamber between the solid divider 328 and the cooling fluid chamber casings 202. The dielectric fluid is contained in the first chamber and the cooling fluid is contained in the second chamber.

Figure 5A:
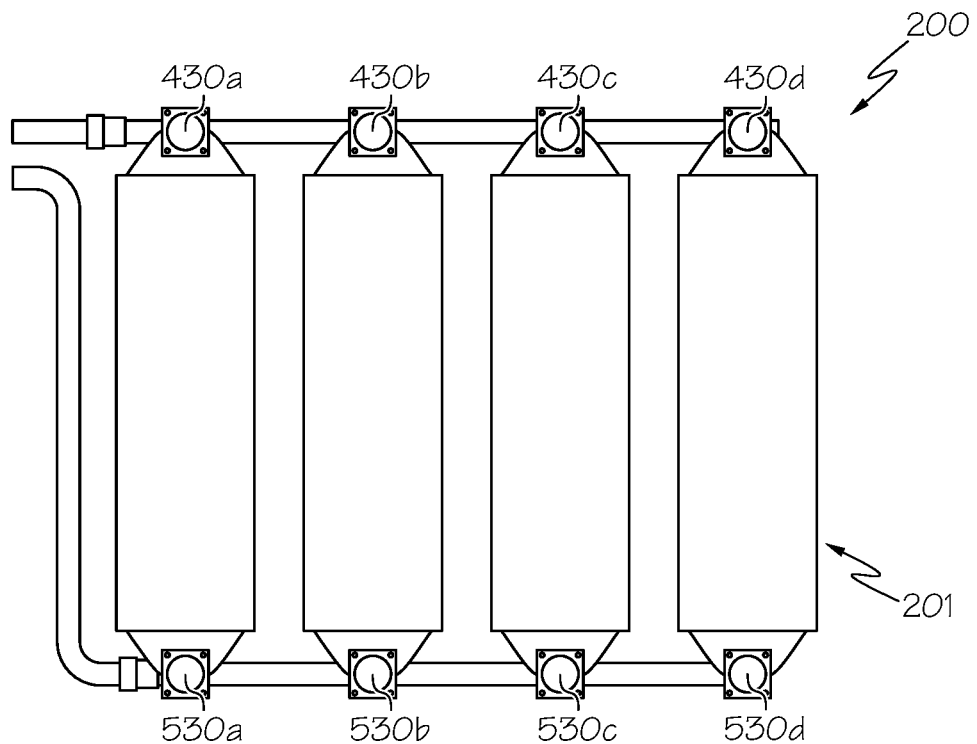
FIGS. 5A-5C depict individual parts of a fluid heat exchanger, according to embodiments described herein.
Figure 5B:
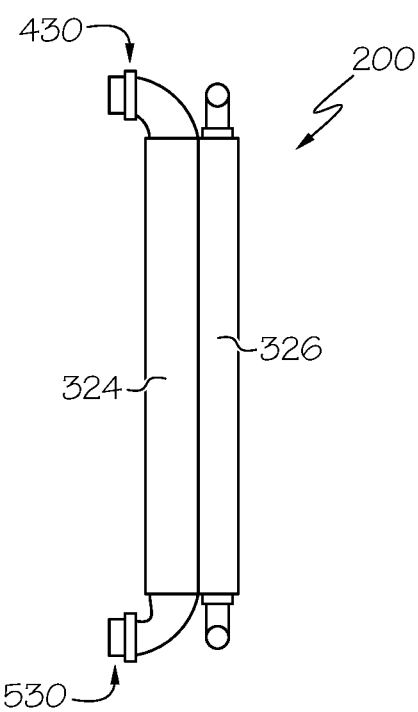
Figure 5C:
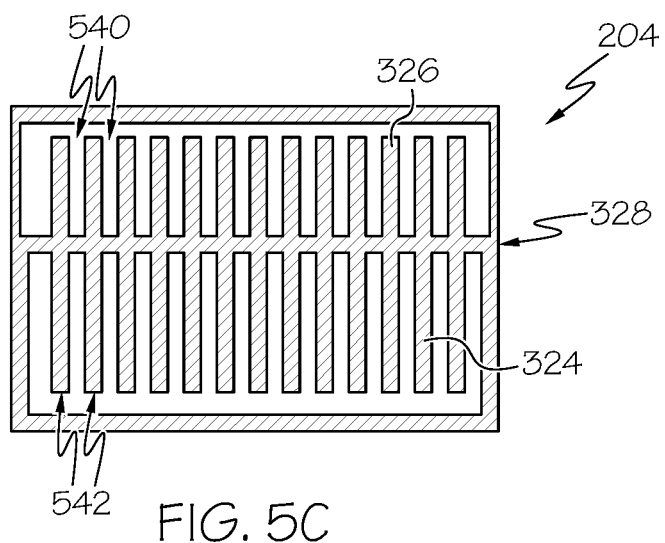

FIGS. 5A-5C depict individual parts of a heat exchanger 200, according to embodiments described herein. As illustrated, FIG. 5A depicts the transformer inlet ports 430, as well as a first transformer outlet port 530a, a second transformer outlet port 530b, a third transformer outlet port 530c, and a fourth transformer outlet port 530*d* (referred to herein collectively as the transformer outlet ports 530) for the finned heat sinks 201 respectively. The finned heat sinks 201 dispense the dielectric fluid back into the transformer 100 via the transformer outlet ports 530. As discussed above, the dielectric fluid may be provided to the heat exchanger 200 via a motor or other mechanism. Similarly, some embodiment may be configured to vary the flow of dielectric fluid for each of the finned heat sinks 201. As an example, if the first finned heat sink 201*a* is experiencing a higher temperature of dielectric fluid, the flow of dielectric fluid and/or cooling fluid may be increased relative to the finned heat sinks 201*b*-201*c*.

FIG. 5B further illustrates the connection between the transformer side 324 and heat exchanger side 326 of the heat exchanger 200. Also illustrated is a side view of the transformer inlet ports 430 and the transformer outlet ports 530.

FIG. 5C depicts one of the fluid communicators 204 in greater detail. Specifically, the transformer side 324 may define the first chamber and may utilize free convection (or other mechanism) to direct the dielectric fluid across a first plurality of cooling fins 540 of the fluid communicators 204. Similarly, the heat exchanger side 326 may define a second chamber and may receive the cooling fluid as described above. The cooling fluid is directed across a second plurality of cooling fins 542 in the fluid communicators 204 via forced convection or other mechanism. As described above, the solid divider 328 prevents physical contact between the cooling fluid and the dielectric fluid while allowing heat to transfer from the dielectric fluid to the cooling fluid.

As will be understood, the fluid communicators 204 may include separate compartments that prevent escape of the respective fluid. Similarly, some embodiments may be configured such that the fluid communicators 204 only create the distinct chambers when coupled with the cooling fluid chamber casings 202 and the plurality of dielectric chamber casings 206.

As illustrated above, various embodiments for a liquid heat exchanger are disclosed. These embodiments may allow cooling of a transformer that is utilized in an indoor environment, while reducing a footprint of the overall system. This allows for greater transformer performance in a small area.

While particular embodiments and aspects of the present disclosure have been illustrated and described herein, various other changes and modifications can be made without departing from the spirit and scope of the disclosure. Moreover, although various aspects have been described herein, such aspects need not be utilized in combination. Accordingly, it is therefore intended that the appended claims cover all such changes and modifications that are within the scope of the embodiments shown and described herein.

It should now be understood that embodiments disclosed herein includes systems and methods for liquid heat exchange for transformers. It should also be understood that these embodiments are merely exemplary and are not intended to limit the scope of this disclosure.

What is claimed is:

1. A method for liquid heat exchange for transformers comprising:
    receiving a dielectric fluid from a transformer, wherein the dielectric fluid has an elevated temperature;
    receiving a cooling fluid;
    directing the dielectric fluid across a first plurality of cooling fins in a first chamber;
    directing the cooling fluid across a second plurality of cooling fins in a second chamber, wherein the first chamber and the second chamber are coupled via a solid divider, wherein the solid divider is configured as a thermal conductor to communicate heat from the dielectric fluid to the cooling fluid, and wherein the solid divider prevents the dielectric fluid from physically contacting the cooling fluid;
    returning the dielectric fluid to the transformer; and
    disposing the cooling fluid after receiving heat from the dielectric fluid.

2. The method of claim 1, further comprising controlling a flow rate of the dielectric fluid across the first plurality of cooling fins.

3. The method of claim 2, wherein the flow rate is variable, based on at least one of the following: a temperature of the dielectric fluid and a temperature of the cooling fluid.

4. The method of claim 1, further comprising recirculating the cooling fluid across the second plurality of cooling fins.

5. The method of claim 1, further comprising:
    directing the dielectric fluid across a third plurality of cooling fins; and
    directing the cooling fluid across a fourth plurality of cooling fins, wherein the third plurality of cooling fins and the fourth plurality of cooling fins are different than the first plurality of cooling fins and the second plurality of cooling fins.

6. A system for liquid heat exchange for transformers comprising:
    a transformer that generates heat, wherein the transformer includes a transformer chamber for circulating a dielectric fluid; and
    a fluid heat exchanger that is closely coupled to the transformer, wherein the fluid heat exchanger comprises:
        a first transformer inlet port that is coupled to the transformer chamber and receives the dielectric fluid from the transformer chamber, wherein the dielectric fluid is received at an elevated temperature;
        a cooling fluid inlet, for receiving a cooling fluid;
        a first finned heat sink that includes a first fluid communicator that receives, at a first chamber, the dielectric fluid from the first transformer inlet port and directs the dielectric fluid across a first plurality of cooling fins, wherein the first finned heat sink receives, at a second chamber, the cooling fluid from the cooling fluid inlet and directs the cooling fluid across a second plurality of fins, wherein the first finned heat sink separates the first chamber from the second chamber with a first solid divider that is thermally conductive such that heat from the dielectric fluid is communicated to the cooling fluid;
        a cooling fluid return that disposes the cooling fluid after receiving heat from the dielectric fluid; and
        a first transformer outlet port that returns the dielectric fluid to the transformer chamber after communicating heat to the cooling fluid.

7. The system of claim 6, further comprising a first motor, wherein flow of the cooling fluid through the fluid heat exchanger is controlled by the first motor that operates in response to communication from a first thermostat.

8. The system of claim 7, further comprising a second motor, wherein flow of the dielectric fluid through the fluid heat exchanger is controlled by the second motor that operates in response to communication from a second thermostat.

9. The system of claim 6, wherein the first finned heat sink further comprises a dielectric fluid casing and a cooling fluid casing for surrounding the first fluid communicator.

10. The system of claim 6, wherein the cooling fluid inlet and the cooling fluid return define at least one of the following: a closed loop and an open loop.

11. The system of claim 6, wherein the fluid heat exchanger further comprises:
- a second transformer inlet port that is coupled to the transformer chamber and receives the dielectric fluid from the transformer chamber;
- a second finned heat sink that includes a third fluid communicator that receives, at a third chamber, the dielectric fluid from the second transformer inlet port and directs the dielectric fluid across a third plurality of cooling fins, wherein the second finned heat sink receives, at a fourth chamber, the cooling fluid from the cooling fluid inlet and directs the cooling fluid across a fourth plurality of fins, wherein the second finned heat sink separates the third chamber from the fourth chamber with a second solid divider that is thermally conductive such that heat from the dielectric fluid is communicated to the cooling fluid; and a second transformer outlet port that returns the dielectric fluid to the transformer chamber after communicating heat to the cooling fluid.

12. The system of claim 11, wherein the cooling fluid inlet and the cooling fluid return are coupled to both the first finned heat sink and the second finned heat sink.

13. The system of claim 11, wherein the dielectric fluid is directed through the first finned heat sink at a first flow rate and wherein the dielectric fluid is directed through the second finned heat sink at a second flow rate.

14. A fluid heat exchanger for liquid heat exchange for transformers comprising:
- a first transformer inlet port that is coupled to a transformer chamber and receives a dielectric fluid from the transformer chamber, wherein the dielectric fluid is received at an elevated temperature;
- a cooling fluid inlet, for receiving a cooling fluid;
- a first finned heat sink that includes a first fluid communicator that receives, at a first chamber, the dielectric fluid from the first transformer inlet port and directs the dielectric fluid across a first plurality of cooling fins, wherein the first fluid communicator receives, at a second chamber, the cooling fluid from the cooling fluid inlet and directs the cooling fluid across a second plurality of fins, wherein the first fluid communicator separates the first chamber from the second chamber with a first solid divider that is thermally conductive such that heat from the dielectric fluid is communicated to the cooling fluid;
- a cooling fluid return that disposes the cooling fluid after receiving heat from the dielectric fluid; and
- a first transformer outlet port that returns the dielectric fluid to the transformer chamber after communicating heat to the cooling fluid.

15. The fluid heat exchanger of claim 14, further comprising:
- a second transformer inlet port that is coupled to the transformer chamber and receives the dielectric fluid from the transformer chamber;
- a second finned heat sink that includes a third fluid communicator that receives, at a third chamber, the dielectric fluid from the second transformer inlet port and directs the dielectric fluid across a third plurality of cooling fins, wherein the second finned heat sink receives, at a fourth chamber, the cooling fluid from the cooling fluid inlet and directs the cooling fluid across a fourth plurality of fins, wherein the second finned heat sink separates the third chamber from the fourth chamber with a second solid divider that is thermally conductive such that heat from the dielectric fluid is communicated to the cooling fluid; and a second transformer outlet port that returns the dielectric fluid to the transformer chamber after communicating heat to the cooling fluid.

16. The fluid heat exchanger of claim 15, wherein the dielectric fluid is directed through the first finned heat sink at a first flow rate and wherein the dielectric fluid is directed through the second finned heat sink at a second flow rate.

17. The fluid heat exchanger of claim 14, further comprising a first motor, wherein flow of the cooling fluid through the fluid heat exchanger is controlled by the first motor that operates in response to communication from a thermostat.

18. The fluid heat exchanger of claim 16, further comprising a second motor, wherein flow of the dielectric fluid through the fluid heat exchanger is controlled by the second motor that operates in response to communication from a thermostat.

19. The fluid heat exchanger of claim 14, wherein the cooling fluid inlet and the cooling fluid return define at least one of the following: a closed loop and an open loop.

20. The fluid heat exchanger of claim 14, wherein the cooling fluid includes at least one of the following: water and saline.

\* \* \* \* \*